United States Patent

Taub et al.

[11] Patent Number: 5,104,746
[45] Date of Patent: Apr. 14, 1992

[54] LENGTH STABILIZED NB-SN WIRE AND ANNEALING METHOD

[75] Inventors: Alan I. Taub; Mark L. Miller, both of Schenectady, N.Y.

[73] Assignee: General Electric Company, Schenectady, N.Y.

[21] Appl. No.: 519,700

[22] Filed: May 4, 1990

Related U.S. Application Data

[62] Division of Ser. No. 331,198, Mar. 31, 1989, Pat. No. 4,983,228.

[51] Int. Cl.$^5$ .............................................. H01L 39/14
[52] U.S. Cl. .................................. 428/614; 428/930
[58] Field of Search ................................ 428/614, 930

[56] References Cited

U.S. PATENT DOCUMENTS 4,983,228  1/1991  Taub et al. ..................... 148/133

FOREIGN PATENT DOCUMENTS 0389940  10/1990  European Pat. Off. .

Primary Examiner—R. Dean
Assistant Examiner—David W. Schumaker
Attorney, Agent, or Firm—James E. McGinness; James C. Davis, Jr.; James Magee, Jr.

[57] ABSTRACT

A method for contraction annealing niobium-tin wire is disclosed. An improved niobium-tin wire is provided by loosely winding the wire on a mandrel, or by coiling the wire on a circumferentially retractile mandrel, and contraction annealing the wire without reaction-forming substantial amounts of $Nb_3Sn$. Such contraction annealing allows the wire to contract in length unconstrained thereby preventing the formation of internal tensile stresses in the wire and its surrounding insulation. Prevention of internal stresses in the wire greatly reduces the susceptibility of the wire to breakage, cracking, sintering, shorting, tin leakage, or substantial shifting of the wire from desired wrap positions when it is reaction annealed to form the brittle super-conducting intermetallic compound $Nb_3Sn$.

3 Claims, 3 Drawing Sheets

LENGTH STABILIZED NB-SN WIRE AND ANNEALING METHOD

This application is a division, of application Ser. No. 07/331,198, filed Mar. 31, 1989 now U.S. Pat. No. 4,983,228.

BACKGROUND OF THE INVENTION

This invention relates to improvements in superconducting wires, and in particular to a method for making niobium-tin alloy wire.

Niobium-tin alloy superconductors are brittle and can be easily damaged, especially when drawn into fine filamentary wire and wound for use in electromagnets. The superconducting material in niobium-tin based superconductors is the intermetallic compound triniobium tin, or $Nb_3Sn$. The $Nb_3Sn$ is the brittle material in the wire and the continuity of $Nb_3Sn$ lamina extending the length of the wire must be protected to maintain the continuous superconducting path within the wire. As a result, wire production is accomplished using the pure metals niobium and tin with heat treatment after wire drawing to react the niobium with the tin to form a continuous layer of $Nb_3Sn$ on the niobium. As used herein a niobium-tin wire is a wire surrounded by a copper sheath which acts as a stabilizer and contains at least niobium and tin. Small amounts of other elements, such as titanium, may be added to improve the current carrying properties of the superconducting $Nb_3Sn$ compound formed after heat treatment. The stabilizer that surrounds the wire helps stabilize some of the wires functions, for example by acting as an alternative current path when the wire changes from superconducting to non-superconducting, and mechanically strengthening the wire.

Heretofore niobium-tin wires have been made by providing a copper sheathed wire containing niobium metal in the form of rods or expanded sheet, and tin in the form of a tin alloy such as bronze or as tin rods surrounded by copper. The niobium and tin are in close proximity so that during subsequent heat treatment tin reacts with niobium to form continuous laminae of $Nb_3Sn$ on the niobium. The process of alloying the tin and niobium to form $Nb_3Sn$ is hereinafter referred to as reaction-forming or reaction annealing.

Before reaction annealing, the wire is ductile and can be easily wound around a mandrel to form a coil. During annealing, the brittle intermetallic compound $Nb_3Sn$ forms within the wire and thereafter the wire can only be wound into a coil by using special precautions. During the annealing process to reaction-form $Nb_3Sn$, many difficulties are experienced that detrimentally affect the superconducting properties of the wire or its ability to be processed. For example, the insulation surrounding the copper sheath can be easily damaged in the annealing process causing the wire to shift or even fuse together. In superconducting magnets formed from the wire if the wire shifts excessively during the anneal, the desired wrap positions are not maintained. When wire wrap positions are not maintained, the desired magnetic field homogeneity is not obtained during operation of the magnet. If wires fuse together or even touch, an electrical short between turns develops. Such shorts make it very difficult to continuously increase the magnetic field in the superconducting magnet when it begins operating. If it is desired to further process the wire after annealing, fused wires make it impossible to unwind the coiled wire without damaging it. Sometimes, hereafter an electrical short is more simply referred to as a short.

Two general prior art methods for reaction-forming $Nb_3Sn$ in a coil form are known. In one method, called the "react and wind" process, the insulated, copper sheathed niobium-tin wire is wound onto a spool and annealed to reaction-form $Nb_3Sn$. Then it is carefully rewound onto a coil form for the superconducting magnet. The anneal is a series of heat treatments ranging from about 200° C. to 700° C. that may take from one to two weeks. The anneal treatments are controlled to react the niobium and tin to form a superconducting $Nb_3Sn$ that will meet the designed current carrying properties required in a superconducting device such as a magnet. If wires fuse together during the anneal, the spool cannot be unwound without damaging the wire and degrading the superconducting properties of the wires.

In a second process called the "wind and react" process, the insulated, copper sheathed, niobium-tin wire is wound directly onto the coil form of the magnet. The wire is then reaction annealed as explained previously in a series of treatments to form the superconducting $Nb_3Sn$. A disadvantage to this method is that the coil form must be made from a material that can withstand the annealing treatments. For example, a fiberglass-resin coil form could not withstand the annealing temperatures. In addition, the magnet formed by this method is very susceptible to the fusing, shorting, and wire shifting problems mentioned previously.

Niobium-tin wire is susceptible to damage in both the wind and react, and the react and wind processes from still other sources in the annealing process. Because tin melts at approximately 230° C. it is molten at the temperatures required to reaction-form the $Nb_3Sn$ wire. Therefore, any punctures or defects in the copper sheathing of the wire may result in leakage of the molten tin. Such defects or punctures can be caused by the wire drawing methods or inclusions in the copper sheath. Tin leakage damages the insulation, creates resistive or normal current conducting regions in the wire, and when leakage is extensive essentially no $Nb_3Sn$ forms. Stresses placed on the wire during annealing have been found to increase the tendency for tin leakage at such inclusion defects or cracks, and for damaging the superconducting path of $Nb_3Sn$.

What we have discovered and found as a contributing cause of the problems recited above is that niobium-tin wire contracts in length during the reaction annealing necessary to form $Nb_3Sn$. Most of the length contraction in the niobium-tin wire can be achieved before the brittle intermetallic $Nb_3Sn$ forms. This is surprising since it is well known that the major constituents of this wire; copper, niobium, and tin or a tin alloy, have positive coefficients of thermal expansion and therefore would be expected to expand and cause the wire to increase in length when heated at temperatures up to 700° C.

Since the niobium-tin wire in prior art annealing was tightly coiled around a solid mandrel, the length contraction caused the wire and its surrounding insulation to develop internal tensile stresses. This occurs because the coiled wire is constrained from contracting on the solid mandrel during the reaction anneal. These stresses can combine with any imperfections, inclusions, or defects in the wire or surrounding insulation to exacerbate punctures, cracks or breaks in the wire and its surrounding insulation. It is important to note that such internal tensile stresses can easily damage the continuous laminae of brittle Nb$_3$Sn that are formed within the wire and extend the length of the wire. As a result, such punctures, cracks or breaks can partially or completely disrupt the superconducting properties of the wire. In addition, during the reaction anneal such punctures, cracks or breaks in the wire will allow molten tin leakage while cracks or breaks in the insulation may allow separate turns of wire to touch causing fusing and shorting of the wire. The wire contraction alone or in combination with damage to the insulation may also cause substantial shifting of the wire from calculated wrap positions desired for optimum performance of a superconducting magnet.

BRIEF DESCRIPTION OF THE INVENTION

This invention is a method for making niobium-tin wire suitable for magnet construction in which method the niobium-tin wire is caused to contract while it is unconstrained, and prior to formation of Nb$_3$Sn. The invention provides an improved niobium-tin wire, sometimes hereinafter referred to as the wire.

According to one method of this invention, niobium-tin wire is disposed so that it will remain unconstrained during a decrease in wire length. The wire is then contraction annealed to cause contraction of the wire without reaction-forming a substantial amount of Nb$_3$Sn. The term "contraction anneal" means the wire is heat treated at a temperature and for a period of time that causes the wire to contract in length for at least a substantial portion of the contraction in length imparted by all prior art anneal cycles for niobium-tin wire. Preferably the contraction anneal causes the wire to contract at least about 50 percent of the length the wire will contract when it is unconstrained and reaction annealed to form Nb$_3$Sn. Such contraction of at least about 50 percent is achieved by contraction annealing at about 170° to 225° C. for at least about 10 hours, or about 225° to 275° C. for at least about 2 hours, or about 275° to 300° C. for at least about 1 hour, or by heating to at least about 300° with no hold period, without reaction-forming substantial amounts of Nb$_3$Sn.

The wire is disposed so that it will remain at a tension that allows it to contract substantially unconstrained by, for example, loosely wrapping the wire around a mandrel so that the coiled wire forms a circumference larger than the mandrel circumference, wrapping the wire around a retractile mandrel that retracts in its circumference in response to the contracting wire, or maintaining a low tension on wire that is being transferred from one coil to another so that the wire can contract substantially unconstrained. Such unconstrained contraction forms a niobium-tin wire that is stabilized in its length dimension.

After contraction annealing the wire is reaction annealed to form brittle Nb$_3$Sn without subjecting it to the high stresses caused by prior art reaction anneals and processing. The reaction anneal is greatly benefited since the wire is much less susceptible to tin leakage, insulation break down, fusing of the wire, and wire breakage, thereby preserving the continuous superconducting path in the wire.

BRIEF DESCRIPTION OF THE DRAWINGS

The following explanation of the invention will be more easily understood by reference to the drawings in which.

DETAILED DESCRIPTION OF THE INVENTION

Improved niobium-tin wire is formed by the method of this invention. The wire is disposed so that it will remain substantially unconstrained during a decrease in wire length. The wire is then contraction annealed to cause the wire to freely contract in length without formation of substantial amounts of Nb$_3$Sn. In a preferred embodiment the contraction anneal causes the wire to contract at least about 50 percent of the length the wire will contract when it is unconstrained and reaction annealed to form Nb$_3$Sn. Such contraction of at least about 50 percent is achieved by contraction annealing between about 170° C. to 225° C. for at least about 10 hours, or between about 225° C. to 275° C. for at least about 2 hours, or between about 275° C. to 300° C. for at least about 1 hour, or by heating to at least about 300° C. with no hold period. The 170° C. to 225° C. temperature range is preferred because tin is not molten in this temperature range so it cannot leak from the wire. The contraction anneal time and temperature are limited so that substantial contraction of the wire is completed before the wire reacts to form appreciable Nb$_3$Sn.

Contraction annealing of the substantially unconstrained niobium-tin wire forms a substantially length stabilized niobium-tin wire. When coiled on a mandrel, a length stabilized wire does not contract to form high internal tensile stresses in the wire when it is reaction annealed. Therefore, a length stabilized niobium-tin wire is an improved niobium-tin wire that is much less susceptible to the tin leakage, fusing, shorting, substantial shifting of windings, and damage to the superconducting path that is caused by the formation of internal tensile stresses in prior art coiled niobium-tin wire and reaction anneals.

The contraction anneal is performed to minimize the formation of internal stresses within the wire when the wire is reaction annealed to form Nb$_3$Sn. To practice the method of contraction annealing to form an improved niobium-tin wire in which wire contraction is minimized during reaction annealing to form superconducting Nb$_3$Sn, the following procedures can be used.

When it is desired to make niobium-tin wire superconducting, the wire in a contracted state can be reaction annealed on a temporary mandrel or on the coil form for a magnet, provided the coil form material can withstand the anneal temperatures. However, first the improvement comprising the method of this invention for contraction annealing niobium-tin wire is performed.

Figure 1:
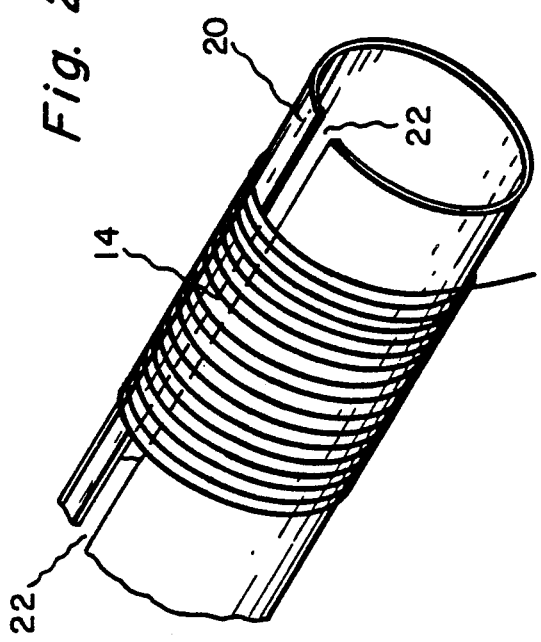
FIG. 1 is a mandrel with a compressible insulating material surrounding it.
Figure 2:
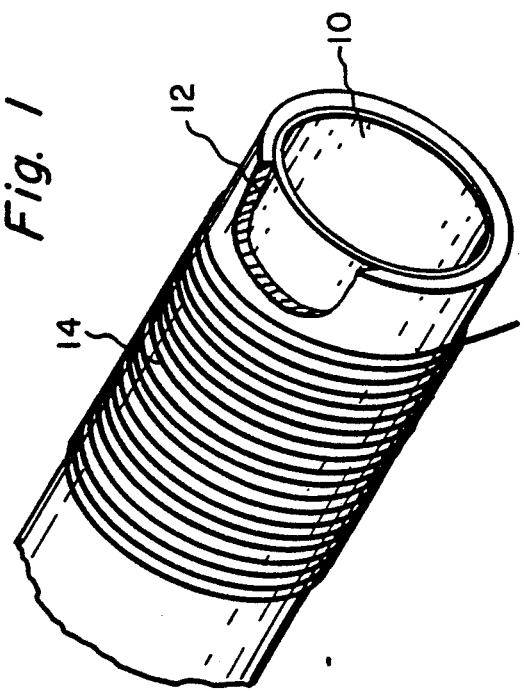
FIG. 2 is a mandrel with a gap in its circumference.

The niobium-tin wire can be wound onto a retractile mandrel that is capable of retracting in its circumference. Two such mandrels are demonstrated in FIGS. 1 and 2. In FIG. 1 a compressible insulating material 12, such as fiberglass, is wrapped around a mandrel 10. Preferably the compressible insulating material is wrapped around the mandrel in an amount sufficient to allow the circumference of the mandrel to retract at least about 0.3 percent. The compressible insulating material will readily compress in response to a contracting wire 14. In FIG. 2 a cylindrical mandrel 20 is shown with a gap 22 in its circumference. Preferably the gap is large enough to allow the circumference of the mandrel to retract at least about 0.3 percent. The gap will readily reduce in response to a contracting wire 14. Such mandrels that have a retractile circumference allow the wire to contract freely. By wrapping the wire around the circumferentially retractile mandrels it is disposed in a manner that allows the wire to contract substantially unconstrained.

If the wire is not wrapped with insulation, an insulating material may be co-wrapped between turns of wire or an anti-fusing agent may be applied to the wire. Depending upon the type of niobium-tin wire being used, and the temperature it will be heated to, there may be a propensity for turns of wire to fuse together. Therefore, the insulating material or anti-fusing agent is preferably used during contraction anneals that are hot enough to cause fusing in a particular type of niobium-tin wire. The coiled wire is then contraction annealed according to any of the contraction annealing time and temperature parameters specified above. During the contraction anneal the mandrel circumference retracts in response to the contracting wire. Since the wire is allowed to contract substantially unconstrained, the coiled wire and its surrounding insulation are not subjected to the tensile stresses that would have developed if the wire had been constrained from contracting as in all prior art niobium-tin wire and reaction anneals.

Alternatively the wire may be loosely wrapped on a solid mandrel. The wire is wound onto the mandrel to form a circumference larger than the mandrel circumference so that it can contract substantially unconstrained. Anti-fusing agents may be applied to the wire depending upon the type of niobium-tin wire and the contraction annealing temperature ranges that are used. The loosely coiled wire is then contraction annealed according to any of the contraction annealing parameters specified above. During the contraction anneal the wire contracts substantially unconstrained.

Optionally the contraction annealed but unreacted wire may be rewound onto a second mandrel. If the wire is not wrapped with insulation an insulating material is cowrapped between the turns of wire or an anti-fusing agent is applied to the wire to prevent wires from fusing. This optional rewinding may be desirable to insure the wire turns are properly protected to minimize fusing of the wires during the higher temperature reaction anneal.

A reaction anneal that forms the desired Nb$_3$Sn is then performed. After the reaction anneal has been completed and the Nb$_3$Sn has been formed the wire is carefully rewound onto the coil form for a superconducting magnet.

It should be understood that the contraction anneal can be carried out in accordance with the times and temperatures for contraction annealing illustrated above as the wire is being heated to the reaction anneal temperature. Therefore by winding the wire on a circumferentially retractile mandrel as described above, and properly controlling the rate of temperature increase to the reaction anneal temperature, the contraction anneal can be performed as the initial portion of the reaction anneal when the wire is being heated to the reaction anneal temperature.

When it is desired to wind the niobium-tin wire directly onto a coil form and reaction-form the brittle Nb$_3$Sn to form a superconducting magnet first the improvement comprising the method of this invention for contraction annealing niobium-tin wire is performed. The wire is contraction annealed to cause length contraction of the wire without forming substantial amounts of brittle Nb$_3$Sn before the wire is wound onto the coil form. The contraction anneal is performed according to any of the time and temperature parameters outlined above.

Figure 3:
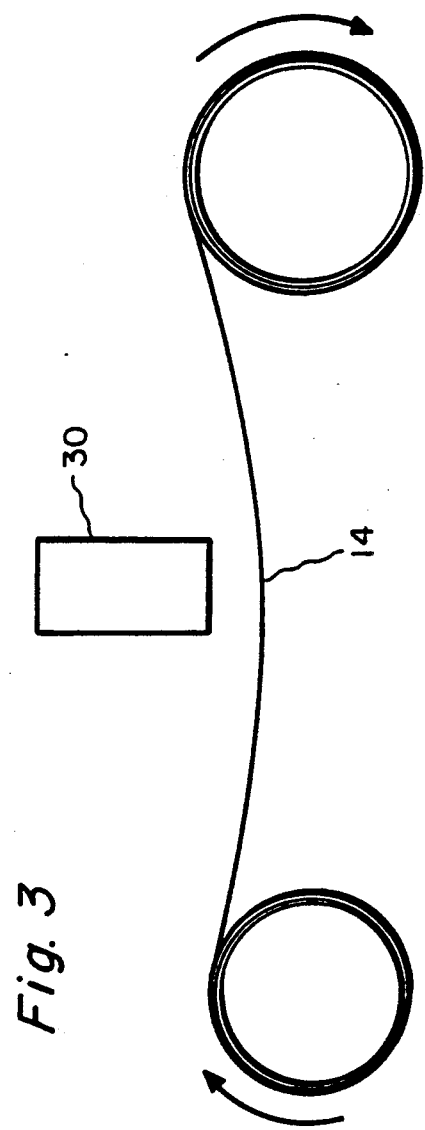
FIG. 3 depicts a process for continuously contraction annealing niobium-tin wire.

The wire must be allowed to contract during the contraction anneal which can be accomplished by loosely winding the wire onto a spool or using the circumferentially retractile mandrels of the prior method. To minimize fusing of the wire, insulation may be co-wrapped between turns of wire or an anti-fusing agent may be applied to the wire as in the prior embodiment. Alternatively the wire can be continuously contraction annealed while winding or unwinding a coil of wire. For example, continuous contraction annealing can be performed according to the method shown by FIG. 3. The wire 14 is passed within an operative range of a heating source 30 that will heat the section of wire within the operative range to one of the contraction annealing temperature ranges. The wire passes by the heating source at a rate that allows the heated portion of wire to be heated to one of the contraction annealing temperature ranges for the period of time required for that contraction anneal temperature range. The wire must be passed by the heat source at a tension that is low enough to allow the wire to contract freely. This allows the wire to be continuously contraction annealed since it will be heated and allowed to contract while the wire is transported from one coil to another. Heating source 30 may be an induction heater, a high energy beam, or a radiant heater such as a resistive element or combustion furnace. Coiling the wire at such low tensions is another method of disposing the wire so it remains at a tension that allows the wire to contract substantially unconstrained. Such contraction annealing relieves a substantial portion of the contraction the wire will be subjected to.

The wire is then wound onto the coil form for the superconducting magnet. If the wire is not wrapped with insulation, an insulating material is co-wrapped between wires or an anti-fusing agent is applied to the wire to prevent wires from fusing during the reaction anneal. The reaction anneal for forming the Nb$_3$Sn can then be performed. Since a substantial portion of the contraction has already been relieved in the wire, the wire is much less susceptible to fusing, shorting, substantial shifting of the windings, tin leakage, and wire cracking or breakage. The wire and its surrounding insulation are not placed in the highly stressed state they would have experienced if a substantial portion of the length contraction had not been relieved.

Figure 4:
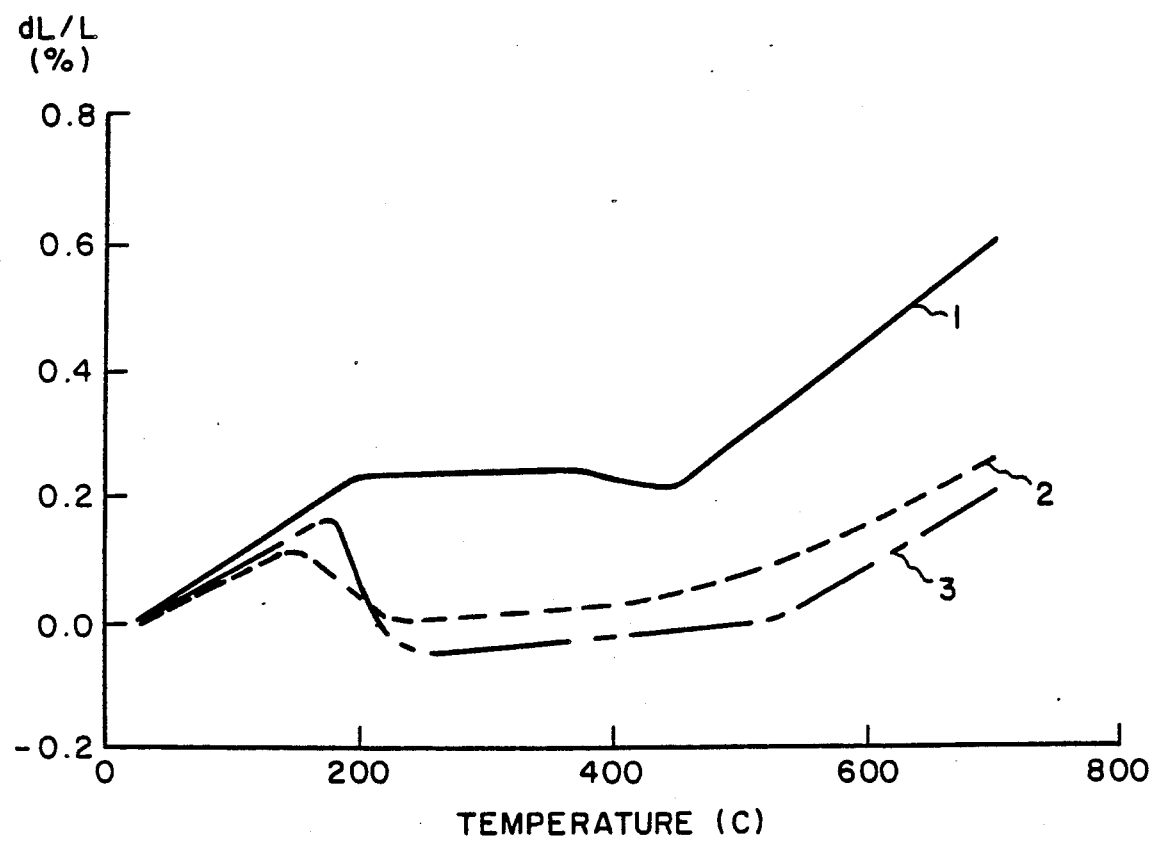
FIG. 4 is a graph of thermal expansion and contraction measurements as a function of increasing temperature taken from three types of niobium-tin wire.

The data represented by the graph of FIG. 4 demonstrate how niobium-tin wire is susceptible to length contraction during annealing. Three different types of niobium-tin wire were tested to make the graph of FIG. 4. The change in length, expressed as dL/L and plotted on the ordinate, was measured in niobium-tin wire that was heated at a rate of approximately 7° C. per minute. As shown in the graph of FIG. 4 the wire initially expanded as would be expected. Between the temperatures of about 150° C. to 200° C. the wire then began to contract as evidenced by the change in length, dL/L, remaining constant or actually reducing. This occurred because the contraction in the wire was offsetting the thermal expansion of the metals. At temperatures somewhere between 425° C. to 550° C. normal expansion resumes as the contraction had been completed.

Figure 5:
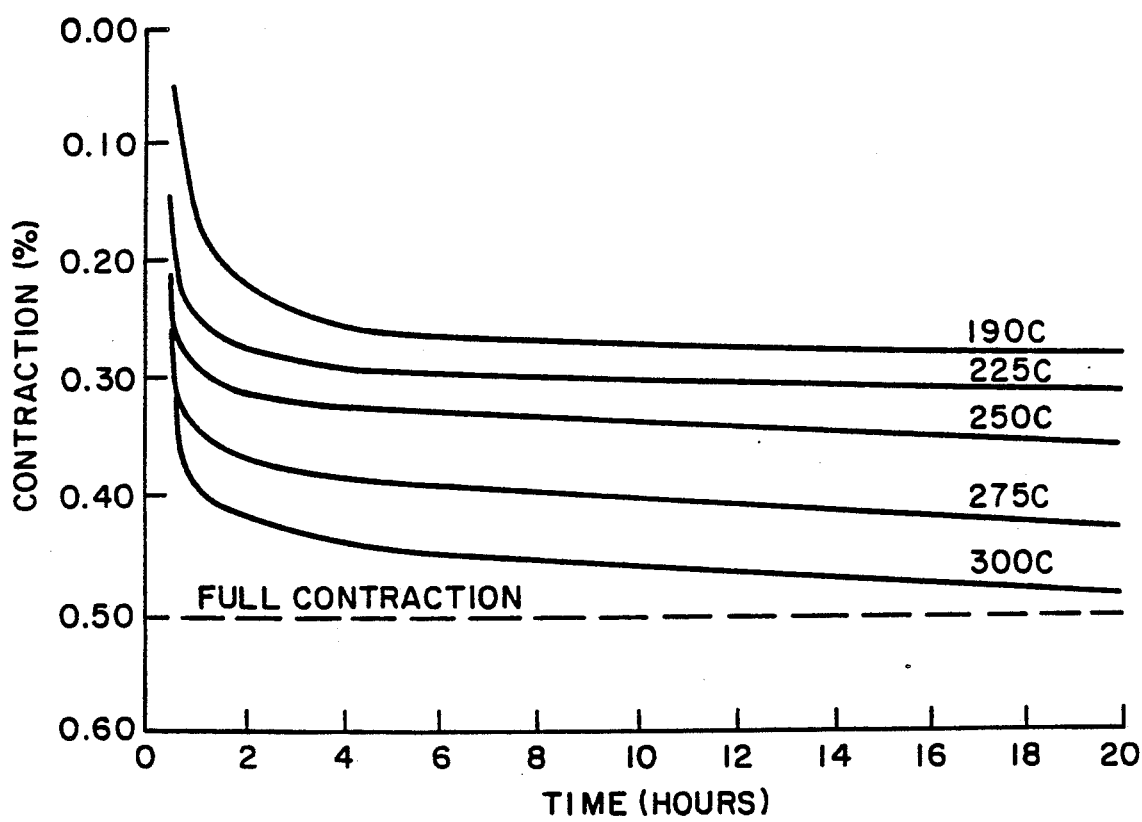
FIG. 5 is a graph depicting the percentage of contraction a niobium-tin wire undergoes at different contraction annealing temperatures over a period of time.

The graph of FIG. 5 further demonstrates the contraction that a niobium-tin wire is subject to. The length of time the wire contracts at contraction annealing temperatures of 190°, 225°, 250°, 275° and 300° C. was measured and the data is shown in the graph of FIG. 5. The wire was heated at the rate of 7° C. per minute to the contraction annealing temperature. The percentage of length contraction is plotted on the ordinate for the period of time it took the contraction to occur as plotted on the abscissa. The graph shows that as the contraction annealing temperature increases, the length of time it takes to substantially contract the wire reduces dramatically. The graph of FIG. 5 shows that a substantial portion of the contraction the wire will undergo can be relieved within the scope of the contraction annealing times and temperatures of this invention. In other words, a substantial portion of the length contraction can be relieved before the wire is reaction annealed to form $Nb_3Sn$.

The total contraction measured for the three types of wire referred to in FIG. 4 as a percentage of the original length of the wire was about 0.4 percent for wire 1, 0.45 percent for wire 2, and 0.5 percent for wire 3.

The method of this invention is further illustrated by the following examples.

EXAMPLES (1) 100 feet of niobium-tin wire was wound on a compressible insulation material surrounding a 12 inch O.D. solid annealing spool. Insulation was co-wrapped between the turns of wire. The compressible insulation material was a loose glass wrap. The wire was then contraction annealed according to prescribed annealing times and temperatures for reaction-forming $Nb_3Sn$. This included heating the wire for 100 hours at 210° C. followed by higher temperature heating.

(2) A 12 inch O.D. annealing spool was modified to have a gap in its circumference by slitting the spool. A 100 foot length niobium-tin wire was wound on the modified spool with insulation co-wrapped between the turns of wire. The wire was then annealed according to prescribed annealing times and temperatures for reaction-forming $Nb_3Sn$. This included heating the wire for 100 hours at 210° C. followed by higher temperature heating.

In Example 1, observation of the annealed wire after the reaction anneal showed the wire had partially compressed the loose glass wrap around the spool. The wire was subjected to minimal stress from the contraction because the wire was allowed to contract substantially unconstrained. This was shown by the inner wraps which were still loosely coiled around the mandrel. The wire and its surrounding insulation were not damaged so that no cracking, breaking, fusing, shorting, or tin leakage was experienced.

In Example 2, observation of the annealing spool after the reaction anneal showed the gap in the circumference of the annealing spool was reduced from 0.25 to 0.10 inch. This represents a reduction in the circumference of the annealing spool of about 0.4 percent. The reduced gap and resultant reduction in circumference of the spool allowed for the wire contraction with minimal stress build up in the wire. Again, the wire and its surrounding insulation remained undamaged.

What is claimed is:

1. A substantially length stabilized niobium-tin wire on a mandrel, comprising:
   a contracted niobium-tin wire wound around the mandrel,
   the wire having been contracted substantially unconstrained without forming substantial amounts of $Nb_3Sn$.

2. A substantially length stabilized niobium-tin wire on a retractile mandrel, comprising:
   a contracted niobium-tin wire wound around a retractile mandrel that is capable of retracting in its circumference,
   the wire having been contracted substantially unconstrained without forming substantial amounts of $Nb_3Sn$.

3. A substantially length stabilized niobium-tin wire on a coil form for a magnet, comprising:
   A contracted niobium-tin wire wound around the coil form,
   the wire having been contracted substantially unconstrained without forming substantial amounts of $Nb_3Sn$.

* * * * *